United States Patent [19]
Ohtaka et al.

[11] Patent Number: 4,658,136
[45] Date of Patent: Apr. 14, 1987

[54] SECONDARY ELECTRON DETECTING APPARATUS

[75] Inventors: Tadashi Ohtaka; Yasushi Nakaizumi, both of Katsuta; Katsuhiro Kuroda, Hachiohji, all of Japan

[73] Assignee: Hitachi, Ltd., Tokyo, Japan

[21] Appl. No.: 828,309

[22] PCT Filed: Apr. 5, 1985

[86] PCT No.: PCT/JP85/00170
§ 371 Date: Dec. 6, 1985
§ 102(e) Date: Dec. 6, 1985

[87] PCT Pub. No.: WO85/04757
PCT Pub. Date: Oct. 24, 1985

[30] Foreign Application Priority Data
Apr. 6, 1984 [JP] Japan .................. 59-67743

[51] Int. Cl.4 .................................... H01J 37/244
[52] U.S. Cl. ................. 250/310; 250/396 R; 250/397
[58] Field of Search ......... 250/310, 397, 396, 396 ML

[56] References Cited
U.S. PATENT DOCUMENTS 3,474,245 10/1969 Kimura et al. ............... 250/310
3,717,761  2/1973 Koike et al. ................. 250/310
4,442,355  4/1984 Tamura et al. ............... 250/310

Primary Examiner—Bruce C. Anderson
Assistant Examiner—Jack I. Berman
Attorney, Agent, or Firm—Antonelli, Terry & Wands

[57] ABSTRACT

The present invention relates to an apparatus for detecting the secondary electrons which are obtained from a sample (4) when the sample is irradiated with an electron beam (2). When this electron beam (2) is subjected to a low acceleration voltage, it is desirable to detect the secondary electrons efficiently without interfering with the deflection of the electron beam (2). In order to solve this subject matter, there is used a means (7) for generating an electric field and a magnetic field which are so perpendicular to each other that they apply deflecting forces in the direction common to the secondary electrons while applying no deflecting force to the electron beam as a whole.

3 Claims, 5 Drawing Figures 4,658,136

SECONDARY ELECTRON DETECTING APPARATUS

TECHNICAL FIELD

The present invention relates to a secondary electron detecting apparatus and, more particularly, to a secondary electron detecting apparatus which is suitable for use in a scanning electron microscope.

BACKGROUND ART

In recent years, the resolution of the scanning electron microscope has been so improved that it has been frequently used at low acceleration voltages, especially for observation of semiconductors so as to avoid damaging the semiconductor with an electron beam.

In the ordinary secondary electron detecting apparatus used in the scanning electron microscope, the secondary electrons emitted from a sample are detected by means of a secondary electron detector through an objective lens magnetic field for focusing the electron beam which irradiates and bombards the sample. A photoelectron multiplication type detector is generally used as the secondary electron detector. This is because that detector has a high detection sensitivity. Since a high voltage for attracting the secondary electrons is applied to the front end of the secondary electron detector, however, it obstructs deflection of the electron beam with the consequent disadvantage that the electron beam is misaligned.

This problem is solved by positioning the secondary electron detector apart from the electron beam. However, this positioning raises another problem that the secondary electrons cannot be efficiently detected.

DISCLOSURE OF INVENTION

An object of the present invention is to provide a secondary electron detecting apparatus which can detect the secondary electrons from a sample efficiently without interfering with the deflection of an electron beam.

According to the present invention, there is provided a secondary electron detecting apparatus comprising: means for generating an electron beam and for irradiating a sample with said electron beam—for generating secondary electrons from said sample at the side of said sample, which is irradiated by said electron beam, with respect to said sample; means for generating an electric field for deflecting said electron beam and said secondary electrons in a first direction; means for generating a magnetic field for deflecting said electron beam in a second direction opposite to said first direction to deflect said secondary electrons in said first direction and to reduce the deflection of said electron beam in said first direction substantially to zero; and means for detecting the secondary electrons which are deflected in said first direction.

BEST MODE FOR CARRYING OUT THE INVENTION

Figure 1:
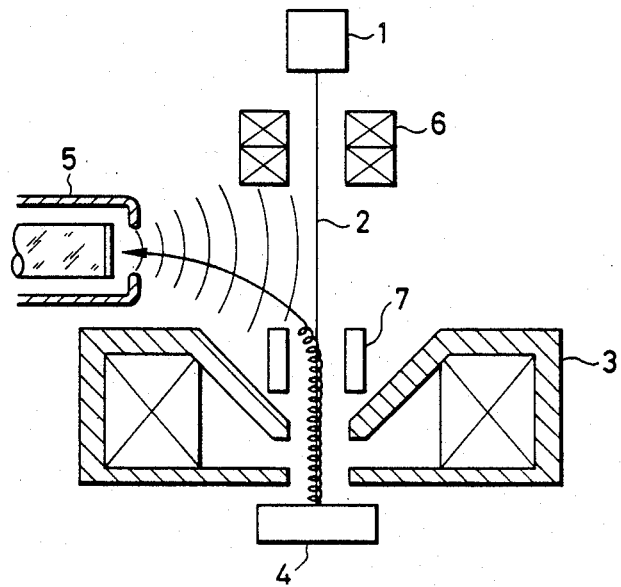
FIG. 1 is a schematic longitudinal section showing a secondary electron detecting apparatus according to one embodiment of the present invention.

With reference to FIG. 1, a low acceleration electron beam 2 generated by an electron beam generator 1 is focused on a sample 4 by a magnetic field type electronic lens 3. When the sample 4 is irradiated with or bombarded by the electron beam 2, information signals characterizing the sample 4 such as secondary electrons, reflected electrons or X-rays are emitted from the sample 4. Of these information signals, the secondary electrons generated at the side of the sample 4, which is irradiated by the electron beam, with reference to the sample 4 are caused to pass through the lens magnetic field of the objective lens 3 while swirling along the axis of the electron beam 2. The secondary electrons thus having passed are detected by means of a photoelectron multiplication type secondary electron detector 5. The output signal of the secondary electron detector 5 is introduced as a brightness modulated signal into a cathode ray tube (not-shown).

A deflector 6 deflects the electron beam 2 in two dimensions so that the sample 4 is scanned in two dimensions by the electron beam 2. The cathode ray of the not-shown cathode ray tube is deflected two-dimentionally in synchronism with the electron beam 2. As a result, an image of the scanned region of the sample 4 by the secondary electrons is displayed in the cathode ray tube.

Figure 2:
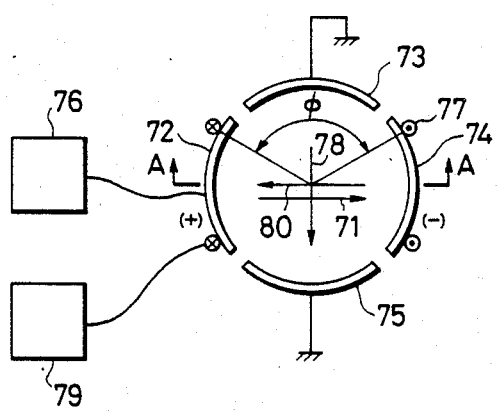
FIG. 2 is a top plan view showing the electron beam misalignment correcting means of FIG. 1.
Figure 3:
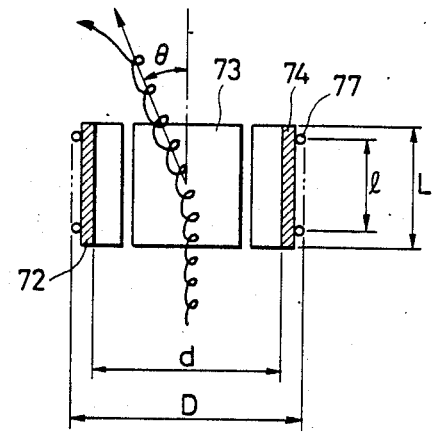
FIG. 3 is a section taken along line A—A of FIG. 2.

Around the axis of the electron beam 2, there is arranged electron beam misalignment correcting means 7 for preventing the misalignment of the electrom beam 2 and for directing the secondary electrons efficiently toward the secondary electron detector 5. This correcting means will be described with reference to FIGS. 2 and 3. Four electrodes 72 to 75 are so arranged equi-distantly around the axis of the electron beam as to establish an electric field in the direction of arrow 71. More specifically, the opposed electrodes 72 and 74 are supplied with positive and negative voltages, respectively, by a power supply 76 whereas the similarly opposed electrodes 73 and 75 are grounded. At the backs of the electrodes 72 and 74, there is arranged an electromagnetic coil 77 which is supplied with an electric current from a power supply 79 so that a magnetic field may be established in the direction of arrow 78 perpendicular to the arrow 71.

The electron beam is subjected, when it passes through the electron beam misalignment correcting means, to both a force in a direction of arrow 80 opposite to the direction of the arrow 71 by the electric field in the direction of the arrow 71 and a force in the direction of the arrow 71 by the magnetic field in the direction of the arrow 78. Here, the forces in the directions of the arrows 71 and 80 are set to be equal to each other. As a result, the electron beam is not deflected.

The secondary electrons from the sample 4 advance in the direction opposite to that of the electron beam so that they are sujbected to a force in the direction of arrow 80 by both the electric field and the magnetic field when they pass through the electron beam misalignment correcting means. As a result, the secondary electrons are directed in the direction of the arrow 80 so that they are detected effectively by the secondary electron detector 5. If the secondary electrons can be thus effectively detected, the secondary electron detector 5 can be positioned apart from the axis of the electron beam. As a result, the electron beam at a high voltage applied to the front end face of the secondary electron detector 5 is prevented from being adversely affected, i.e., from being deflected.

Figure 4:
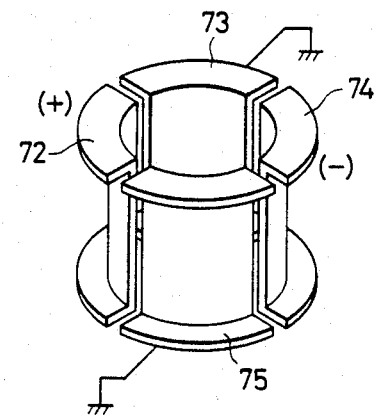
FIG. 4 is a perspective view showing the electrodes shown in FIGS. 2 and 3.
Figure 5:
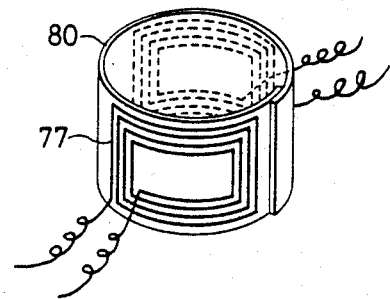
FIG. 5 is a perspective view showing the coil shown in FIGS. 2 and 3.

The electrodes 72 to 75 may be so shaped as are shown in FIG. 4. Moreover, the deflecting coil 77 may be formed on a flexible printed plate 80, as shown in FIG. 5. If the flexible printed plate 80 formed with that coil 77 is wound on the outer faces of the electrodes of FIG. 4, there can be provided the electron beam misalignment correcting means for directing the secondary electrons efficiently toward the secondary electron detector 5 while preventing the misalignment of the electron beam 2, as has been described with reference to FIGS. 2 and 3.

If the acceleration voltage of the electron beam is at 1 kV; if the deflection angle of the secondary electrons are set at 30° (as indicated at $\theta$ in FIG. 3); if the internal diameter of the deflecting electrodes is set at 16 mm (as indicated at d in FIG. 3); if the length of the deflecting electrodes is set at 14 mm (as indicated at L in FIG. 3); if the diameter of the deflecting coil is set at 20 mm (as indicated at D in FIG. 3); if the length of the deflecting coil is set at 10 mm (as indicated at l in FIG. 3); and if the central angle of the deflection coil is set at 120° (as indicated at $\phi$ in FIG. 2), the electric field, the magnetic field, the voltage difference of the deflecting plates, and the magnitude of the magnetic field can be calculated for the respective energies of the secondary electrons, as itemized in Table 1.

The result reveals that the voltage for deflecting the secondary electrons of 5 eV by 30° toward the secondary electron detector may be 9.92 V whereas the deflecting coil may be 0.59 amperes/turn. If this relationship is selected, as has been described hereinbefore, only the secondary electrons can have their trajectory deflected in the direction toward the secondary electron detector without interfering with the deflection of the electron beam. The secondary electron energy has its peak at 2 eV and reaches about 5 eV at most so that most of the secondary electrons can be guided into the secondary electron detector by setting the aforementioned specific numerical values tabulated in Table 1.

As a result, the secondary electron detector can be arranged in a position sufficiently apart from the axis of the electron beam so that the electron beam is not deflected even when it is accelerated at low voltage.

TABLE 1

| Secondary Electron Energy (eV) | 1 | 2 | 5 | 10 |
| --- | --- | --- | --- | --- |
| Electric Field (V/mm) | 0.12 | 0.24 | 0.62 | 1.28 |
| Deflecting Plate Voltage Diff. (V) | 1.92 | 3.84 | 9.92 | 20.5 |
| Magnetic Field (Gauss) | 0.06 | 0.13 | 0.33 | 0.67 |
| Deflecting Coil Amperes/ Turn | 0.11 | 0.23 | 0.59 | 1.2 |

Although one embodiment of the present invention has been described as to the case in which the secondary electrons are to be detected above the focusing lens, similar effects can also be expected even when the secondary electrons are to be detected below the focusing lens.

What is claimed is:

1. A secondary electron detecting apparatus comprising: means for generating an electron beam and for irradiating a sample with said electron beam—for generating secondary electrons from said sample at the side of said sample, which is irradiated by said electron beam, with respect to said sample; means for generating an electric field for deflecting said electron beam and said secondary electrons in a first direction; means for generating a magnetic field for deflecting said electron beam in a second direction opposite to said first direction, thereby reducing the deflection of said electron beam in said first direction substantially to zero, and deflecting said secondary electrons in said first direction and to means for detecting the secondary electrons which are deflected in said first direction.

2. A secondary electron detecting apparatus as set forth in claim 1, wherein said electric field and said magnetic field are generally perpendicular to each other.

3. A secondary electron detecting apparatus as set forth in claim 1, further comprising a magnetic field type electronic lens for focusing said electron beam on said sample, wherein said secondary electrons are guided to pass through the lens magnetic field of said magnetic field type electronic lens and deflected in said first direction by said electric field and said magnetic field.

* * * * *